United States Patent [19]

Enomoto et al.

[11] Patent Number: 5,175,060

[45] Date of Patent: Dec. 29, 1992

[54] LEADFRAME SEMICONDUCTOR-MOUNTING SUBSTRATE HAVING A ROUGHENED ADHESIVE CONDUCTOR CIRCUIT SUBSTRATE AND METHOD OF PRODUCING THE SAME

[75] Inventors: Ryo Enomoto; Motoo Asai; Yoshikazu Sakaguchi, all of Gifu, Japan

[73] Assignee: Ibiden Co., Ltd., Ogaki, Japan

[21] Appl. No.: 663,933

[22] PCT Filed: Jun. 29, 1990

[86] PCT No.: PCT/JP90/00851

§ 371 Date: Mar. 1, 1991

§ 102(e) Date: Mar. 1, 1991

[30] Foreign Application Priority Data

Jul. 1, 1989 [JP] Japan ................... 1-170006
Jan. 24, 1990 [JP] Japan ................... 2-12711
Jan. 24, 1990 [JP] Japan ................... 2-12712

[51] Int. Cl.⁵ .............. H01L 21/56; H01L 21/58; H01L 21/60
[52] U.S. Cl. ............................. 428/620; 437/220; 437/211; 29/827; 428/901; 257/676; 257/672; 257/668
[58] Field of Search ........... 437/206, 207, 182, 220, 437/245, 246, 915, 211; 357/69, 70; 428/620; 156/901; 427/96, 98, 901; 29/827

[56] References Cited

U.S. PATENT DOCUMENTS

| 4,118,595 | 10/1978 | Pfahnl et al. ............... 437/235 |
| 4,246,595 | 1/1981 | Noyori et al. ............... 357/69 |
| 4,767,049 | 8/1988 | Butt et al. ................... 228/179 |
| 4,876,588 | 10/1989 | Miyamoto .................... 357/81 |
| 5,055,321 | 10/1991 | Enomoto et al. ........... 427/98 |

FOREIGN PATENT DOCUMENTS 60-244035 12/1985 Japan ................... 437/220

OTHER PUBLICATIONS

Japanese Utility Model Appln. No. 62-89861 Date of Appln., Jun. 10, 1987.
Japanese Utility Model Laid Open: No. 63-197356, Date of Laid open Dec. 19, 1988.

*Primary Examiner*—Olik Chaudhuri
*Assistant Examiner*—David E. Graybill
*Attorney, Agent, or Firm*—Dvorak and Traub

[57] ABSTRACT

A method of making a semiconductor-mounting substrate suitable for high density packaging and the substrate so made. In order to package an electron part having many terminals to be mounted in a high density, the substrate is constructed by using a lead frame comprised of a die pad and leads as a base, forming an adhesive layer or further an insulating layer onto the lead frame, forming a conductor circuit thereon by an additive process and connecting the conductor circuit and the leads to each other through a plated conductor. According to this construction, it is not required to provide a printed circuit board for IC mounting, and IC can directly be mounted onto the lead frame through the plated conductor circuit.

12 Claims, 11 Drawing Sheets

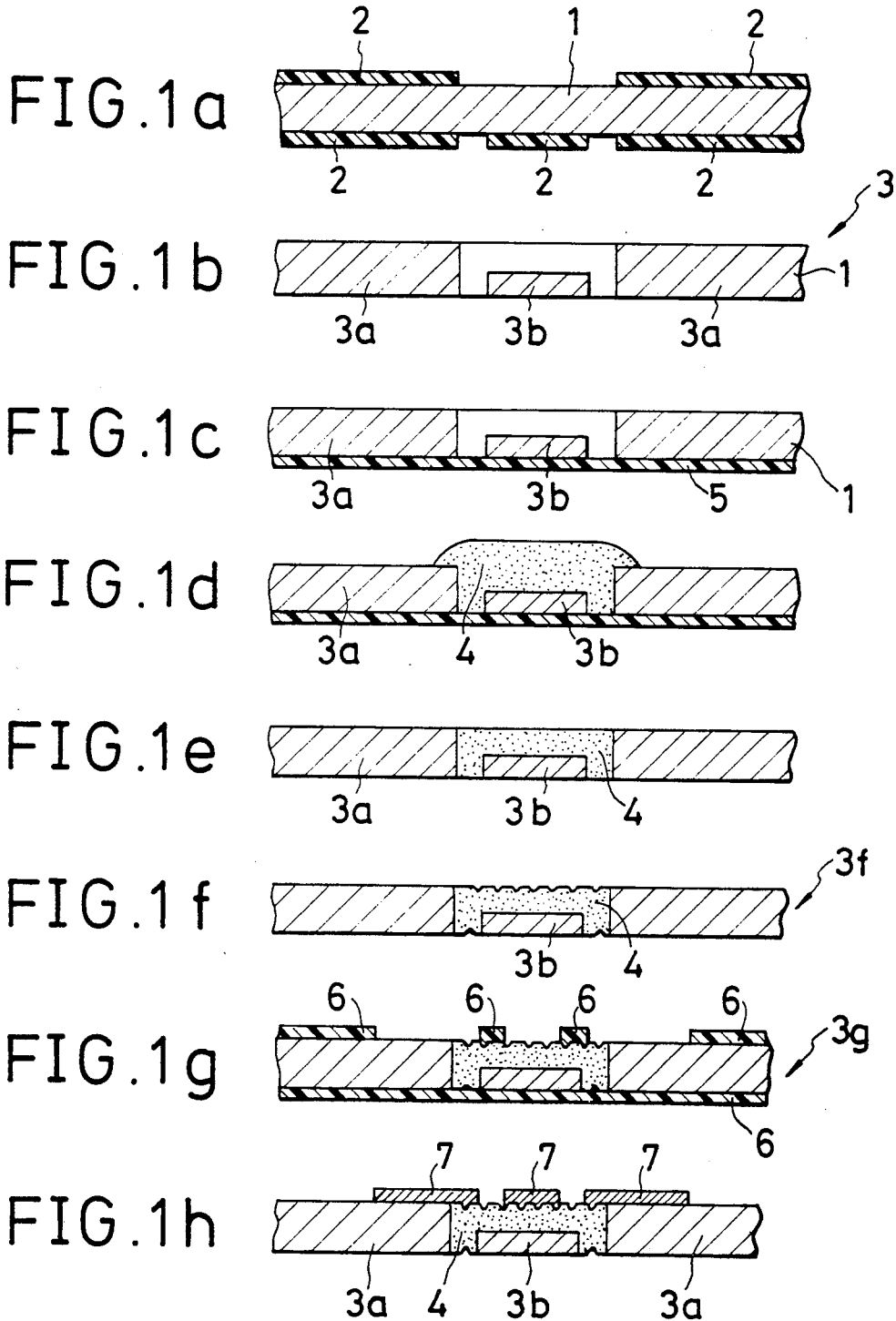

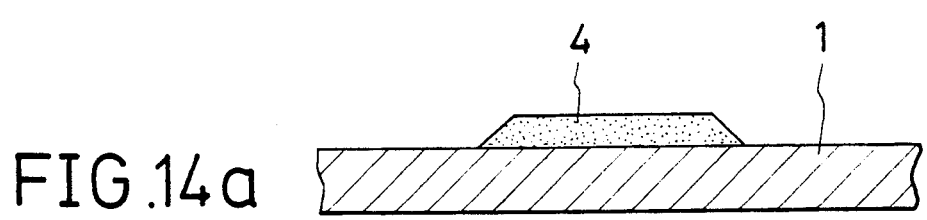
FIG.14a
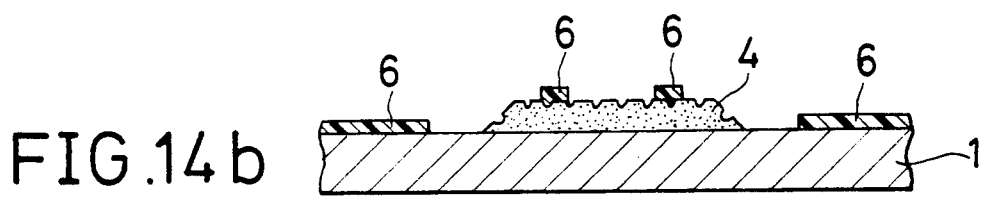
FIG.14b
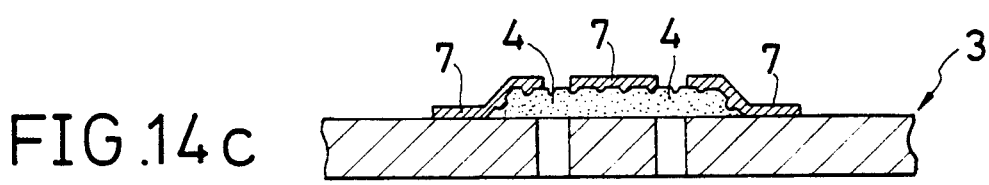
FIG.14c
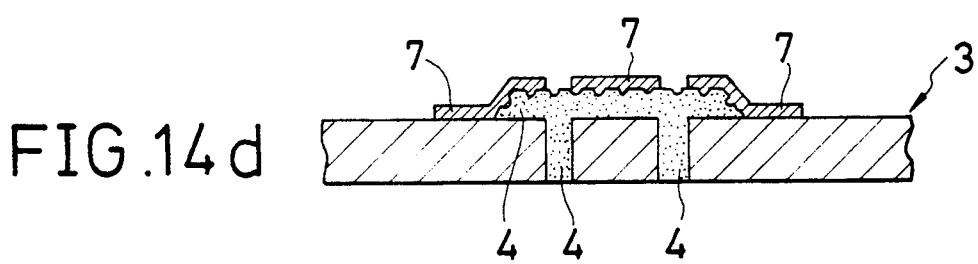
FIG.14d
FIG.15
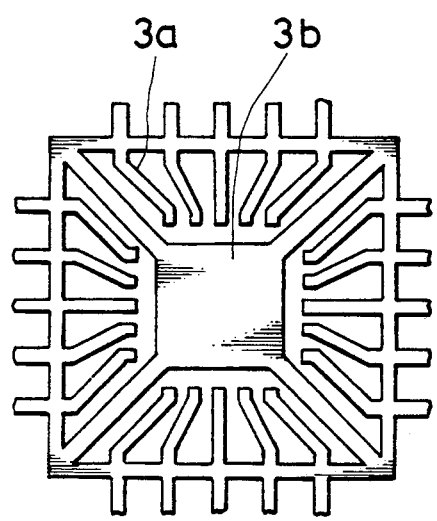

LEADFRAME SEMICONDUCTOR-MOUNTING SUBSTRATE HAVING A ROUGHENED ADHESIVE CONDUCTOR CIRCUIT SUBSTRATE AND METHOD OF PRODUCING THE SAME

TECHNICAL FIELD

This invention relates to a semiconductor-mounting substrate, and more particularly to a semiconductor-mounting substrate advantageously used for mounting semiconductor parts of multiple terminals in a high density and a method of producing the same.

BACKGROUND ART

There is a problem of obtaining a connection of a semiconductor part having a large pin number to a printed circuit board (substrate).

In general, the connection between the semiconductor part having a large pin number and the printed circuit board (substrate) is carried out by packaging. Particularly, a single chip type package mounting only one semiconductor part is typical.

Heretofore, one of such packages is called a PGA (Pin Grid Array) type. This package is constructed by connecting the semiconductor parts to a conductor circuit formed on the substrate using many conductor pins according to a given arrangement. Furthermore, a package called a TAB (Tape Automated Bonding) type is constructed by connecting a finger lead formed as a part of the conductor circuit on the substrate and connected to electronic circuit parts by thermal pressing and then potting it with a resin for sealing. Also, a packaged called a QFP (Quad Flat Package) type is constructed by connecting a lead frame to a semiconductor part through wire bonding and then subjecting it to transfer molding.

However, each of the conventional packages has defects. That is in the PGA package the pitch distance between the conductor pins is restricted, so that it is difficult to make the packaging density high. Furthermore, in the TAB type packages, it is necessary to use a special mounting machine in the heat pressing of finger leads to a semiconductor part, which is costly. Moreover, in the QFP type packages, it is difficult to form a fine pattern, so that the high density formation is not possible.

The inventors have particularly studied the QFP type package. As a result, when a semiconductor part, having a large number of terminals, is mounted onto the package, the substrate and particularly lead frame, having a fine pattern, should be used. However, the lead frame forming the substrate usually has a thickness of about 150 μm for providing the strength. Therefore, the lead frame having such a thickness is difficult to be subjected to an etching, and particularly it is very difficult to form a lead frame having a fine pattern.

On the contrary, there have hitherto been proposed some techniques for improving the QFP type packages. For example, there is a package of such a type that the semiconductor part and lead frame are connected through a substrate provided with a fine conductor circuit. For instance, there are known (a) a substrate having a conductor circuit and a lead frame which are electrically connected by wire bonding, and further the conductor circuit on the substrate and the semiconductor are connected by wire bonding and thereafter such an assembly is subjected to transfer molding to form a package; and (b) a substrate having a conductor circuit and a lead frame electrically connected by through-holes, and the conductor circuit and the semiconductor part are connected by wire bonding, and thereafter the assembly is subjected to transfer molding to form a package.

However, the former package in (a) has problems that the connection reliability is lacking because the connection of the lead frame to the circuit of the substrate is carried out by wire bonding. On the other hand, in the latter package (b), the connection of the lead frame to the circuit of the substrate is carried out by the through-holes, and high connection reliability is obtained, but there is a problem that the production process becomes very complicated. Furthermore, all of these improved packages are manufactured by combining the existing substrate with the existing lead frame, so that the cost becomes undesirably high.

An object of the invention is to establish a technique such that a semiconductor-mounting substrate used for mounting a semiconductor part, having many terminals onto a printed circuit board in a high density, can simply be manufactured with a high connection reliability and a low cost.

DISCLOSURE OF THE INVENTION

The semiconductor-mounting substrate capable of achieving the above object is characterized by directly forming a desired conductor circuit onto a lead frame through an insulating layer, wherein an adhesive layer is arranged on at least a part of the lead frame directly or indirectly through the insulating layer, and the conductor circuit is formed by an additive process through the adhesive layer, and the conductor circuit is connected to leads of the lead frame by plating.

A first invention is a semiconductor-mounting substrate comprising a lead frame, an adhesive layer formed on a part of the lead frame, a conductor circuit of one or plural layers formed through the adhesive layer by an additive process, and a plated conductor for connecting the conductor circuit to leads of the lead frame.

A second invention is a semiconductor-mounting substrate comprising a lead frame, an insulative material arranged in at least one position among a gap between a lead and a die pad of the lead frame, a gap between the leads and a surface of the lead frame, an adhesive layer formed on at least a part of the lead frame at a state of arranging the insulating material, a conductor circuit of one or multi-layers formed through the adhesive layer by an additive process, and a plated conductor for connecting the conductor circuit to leads of the lead frame.

Such semiconductor-mounting substrates can be manufactured by the following four methods:

A first method produces a semiconductor-mounting substrate formed by arranging a conductor circuit on a lead frame through an insulating layer, characterized in that said semiconductor-mounting substrate is produced through each of the following processes (a), (b), (c) and (d):

(a) a step of shaping a base material into a lead frame;
(b) a step of forming an adhesive layer on at least a part of the lead frame;
(c) a step of forming a conductor circuit on the adhesive layer by an additive process;

(d) a step of connecting the conductor circuit to leads of the lead frame through a conductor circuit for connection obtained by plating.

A second method produces a semiconductor-mounting substrate formed by arranging a conductor circuit on a lead frame through an insulating layer, characterized in that said semiconductor-mounting substrate is produced through each of the following steps (a), (b), (c), (d) and (e).

(a) a step of shaping a base material into a lead frame;
  (b) a step of filling or coating an insulating material to at least one position in a gap between a lead and a die pad of the lead frame, a gap between the leads and a surface of the lead frame;
  (c) a step of forming an adhesive layer on at least a part of the lead frame;
  (d) a step of forming a plated conductor circuit on the adhesive layer by an additive process;
  (e) a step of connecting the plated conductor circuit to the leads of the lead frame by plating.

A third method produces a semiconductor-mounting substrate formed by arranging a conductor circuit on a lead frame through an insulating layer, characterized in that said semiconductor-mounting substrate is produced through each of the following steps (a), (b), (c) and (d):

(a) a step of forming an adhesive layer on at least a part of a substrate;
  (b) a step of forming a plated conductor circuit on the adhesive layer by an additive process;
  (c) a step of connecting the plated conductor circuit to a part of the base material by plating;
  (d) a step of subjecting the base material to etching to form a lead frame.

A fourth method produces a semiconductor-mounting substrate formed by arranging a conductor circuit on a lea frame through an insulative layer, characterized in that said semiconductor-mounting substrate is produced through each of the following steps (a), (b), (c), (d) and (e):

(a) a step of forming an adhesive layer on at least a part of a base material;
  (b) a step of forming a plated conductor circuit on the adhesive layer by an additive process;
  (c) a step of connecting the plated conductor circuit to a part of the base material by plating;
  (d) a step of subjecting the base material to an etching to form a lead frame;
  (e) a step of filling or coating an insulating material to at least one position among a gap between a lead and a die pad of the lead frame, a gap between the leads and a surface of the lead frame.

In the semiconductor-mounting substrate according to the invention, a lead frame as a base is prepared by first subjecting a steel sheet to a punching or an etching to form a die pad and/or leads, or by etching in the course of the production steps, i.e., after forming of the adhesive layer on the substrate (metal sheet). Further, it is desirable that at least a part of the surface of the lead frame is roughened by oxidation reduction treatments prior to forming of the adhesive layer.

In the semiconductor-mounting substrate according to the invention, the adhesive layer is formed on at least a part of the lead frame inclusive of the die pad, i.e., one or more positions among gaps between the die pad and the leads, a gap between the leads, both these gaps, the surface of the die pad or the lead portion or both surfaces.

In the semiconductor-mounting substrate according to the invention, the conductor circuit is formed on an adhesive layer having an insulating undercoat by an additive process. That is, this conductor circuit formed by the plating of the additive process is formed, not only on the surface of the adhesive layer, but also in the adhesive layer or sometimes in the form of multi-layers through a through-hole. Moreover, it is desirable to carry out the multi-layer formation by a so-called build-up method.

The reason why the conductor circuit is formed through the adhesive layer is that a conductor circuit of a fine pattern is easily formed by the above methods. Secondly, the conductor circuit formed on the adhesive layer and the leads of the lead frame can simply be connected by the plating, so that the substrate according to the invention can obtain a very high contact reliability.

Furthermore, in the semiconductor-mounting substrate according to the invention, a layer of insulating material is mainly formed prior to the formation of the adhesive layer. That is, the insulation material layer is filled in at least one position among gaps between the leads and the die pad of the lead frame, a gap between the leads and the surface of the lead frame. The reason why the insulating material is arranged on top of the lead frame, before forming of the adhesive layer, is based on the fact that each of the leads and the die pad are reinforced by integral union. At the same time, the gap between the leads and the gaps between the lead and the die pad are adequately insulated. Thermosetting heat-resistant resins such as bisphenol A-type epoxy resin, phenol novolak epoxy resin, cresol novolak epoxy resin and the like are preferably used.

Moreover, according to the invention, at least a part of the lead frame includes a portion of only the insulating material layer arranged on the die pad or the lead or filled in the gaps, that is, the surface of the insulating material and the inside of the insulating material, for example, in the case of forming an inner layer circuit via a hole or a through-hole.

The insulating material layer may be replaced with the above adhesives in accordance with the material used. In this case, the adhesive layer is naturally formed in the gaps between the leads and the die pad of the lead frame or in the gaps between the leads.

In the semiconductor-mounting substrate according to the invention, the conductor circuit for connecting the conductor circuit formed through the above adhesive layer to the leads of the lead frame is formed by plating. Preferably, the main conductor circuit on the adhesive layer and the lead connecting conductor circuit are integrally formed by plating. In this case, the process becomes simple and the connection reliability is improved. Of course, the conductor circuit for connecting the main conductor circuit to the lead frame may be connected to the main conductor circuit previously formed through the adhesive layer, for example, in a subsequent plating method. Here, the plated conductor means a conductor layer or conductor coating formed by plating.

As the adhesive constituting the above adhesive layer, it is preferable to disperse at least one heat-resistant particle soluble in an oxidizing agent or acid which is selected from the group consisting of:

(a) a mixture of heat-resistant resin particles having an average particle size of 2–10 μm and a fine powder of heat-resistant resin having an average particle size of not more than 2 μm;

(b) a pseudo-particle obtained by adhering a fine powder of heat-resistant resin having an average particle size of not more than 2 μm to a surface of a heat-resistant resin particle having an average particle size of 2 to not more than 10 μm;

(c) an agglomerated particle having an average particle size of 2-10 μm obtained by agglomerating a fine powder of heat-resistant resin having an average particle size of not more than 2 μm with a heat-resistant resin hardly soluble in the oxidizing agent or acid.

The use of such an adhesive forms a uniformly roughened surface. That is, in the case of using the adhesive according to the invention, there is produced a large difference in the solubility to the oxidizing agent or acid between the above heat-resistant particle and a heat-resistant resin constituting the matrix. When conducting a treatment with the oxidizing agent or acid, only the heat-resistant particles dispersed in the surface portion of the adhesive layer are preferentially dissolved and removed. Therefore, the surface of the adhesive layer, after the treatment with the oxidizing agent or acid, is uniformly roughened by the heat-resistant particles, and develops an excellent anchor effect with the conductor circuit later formed on the surface. As a result, the plated conductor circuit formed by the additive process has a high adhesion strength and ensures reliability.

Moreover, in the roughening treatment of the adhesive layer with the oxidizing agent or acid, it is preferable that the surface, to be treated, is previously subjected to a pretreatment, for example, by polishing with a finely divided polishing material, liquid foaming or the like. Therefore, the roughening treatment with the oxidizing agent or acid is carried out after the pretreatment.

As for the above heat-resistant particles in the adhesive, resins having excellent heat resistance and electrical insulation and indicating stability against chemicals other than the oxidizing agent or acid are used. As for the resin, at least one of epoxy resin, polyester resin, and bismaleimide-triazine resin is used, and particularly the use of the epoxy resin is preferable.

As for the oxidizing agent or acid used in the surface roughening treatment of the adhesive layer, chromic acid, chromate, permanganate, ozone, nitric acid, sulphuric acid, hydrochloric acid and the like may be used.

Moreover, when the plated conductor circuit is formed on top of the adhesive layer and the lead frame by the additive process, it is preferable to eliminate the stepwise difference as far as possible. The acceptable thickness of the stepwise difference is preferably not more than 50 μm. If the stepwise difference becomes large, it is desirable to form a taper.

Furthermore, the adhesive layer has a function serving as an insulation between the die pad of the lead frame and the plated conductor circuit. The preferable thickness of the adhesive layer is 5-30 μm.

The additive process adopted in the invention is firstly a so-called full additive process in which the conductor circuit is formed by conducting an electroless plating, after the formation of a plating resist on the seeding formed adhesive layer. Secondly, a semi-additive process, wherein the electroless plating is made over a full surface of the nucleus formed adhesive layer to form a conductor layer. Then an etching resist is formed on the surface of the conductor layer and etched to form a pattern.

In the above full additive process, the plating resist may be removed, or may be left as a permanent resist to coexist with the conductor circuit. In the invention, removal is preferable. In the mounting of semiconductor elements or the like, the connection between the semiconductor element and the conductor circuit is made by wire bonding, but if the plating resist remains, the bonding is difficult due to the presence of the plating resist.

In the invention, an insulating layer is further formed on the lead frame in addition to the above adhesive layer to form an inner layer circuit, whereby the conductor circuit may be multilayered.

As for the metal to be used in the above electroless plating or electro-plating, it is desirable to use gold, silver, copper, nickel or the like as well as an alloy thereof. Particularly, when the semiconductor part is connected to the conductor circuit through a gold wire by the wire bonding method, a combination of gold-/nickel/copper (conductor circuit) is preferably used for enhancing the connection reliability of the gold wire. Further, it is advantageous to previously conduct gold plating in the semiconductor mounting portion.

It is desirable to package the semiconductor-mounting substrate according to the invention by sealing with a resin by a potting method or a transfer molding method after the mounting of the semiconductor parts. The resin can be silicone resin, epoxy resin and the like.

The method of producing the semiconductor-mounting substrate according to the invention will be described below.

The semiconductor-mounting substrate according to the invention is produced through the following steps. The invention is a one-piece body of lead frame obtained by using a lead frame as a base and forming an insulating layer comprised of insulating material or adhesive thereon and further forming a necessary conductor circuit on the surface or on the inside of the insulating layer. The most popular method of producing the substrate according to the invention is conducted through the following four steps.

The fundamental production steps are as follows:
(a) the step of subjecting a base material to punching or the like to form a lead frame provided with a die pad;
(b) the step of forming an adhesive layer on at least a part of the lead frame;
(c) the step of forming a plated conductor circuit on the adhesive layer by an additive process;
(d) the step of connecting the plated conductor circuit to leads of the lead frame by plating.

In addition, the invention may take a method of previously forming an insulating layer prior to the formation of the adhesive layer. In this case, the production is characterized through the following five steps:
(a) the step of subjecting a substrate to punching or the like to form a lead frame provided with a die pad;
(b) the step of filling or coating an insulating material in gaps between the leads and the die pad of the lead frame or to at least one position of gaps between the leads and the surface of the lead frame;
(c) the step of forming an adhesive layer on at least a part of the lead frame provided with the insulating material;

(d) the step of forming a plated conductor circuit on the adhesive layer by an additive process;

(e) the step of connecting the plated conductor circuit to leads of the lead frame by plating.

Furthermore, the semiconductor-mounting substrate according to the invention may be produced by a method of using a base material (metal sheet) as a starting material, forming an insulating layer thereon and then shaping it to a lead frame in addition to the case of using the lead frame as a starting material. In this case, the production is characterized through the following steps:

(a) the step of forming an adhesive layer on at least a part of a base material (metal sheet);

(b) the step of forming a plated conductor circuit on the adhesive layer by an additive process;

(c) the step of connecting the plated conductor circuit to the substrate by plating;

(d) the step of etching the substrate to form a lead frame provided with a die pad; or (a) the step of forming an adhesive layer on at least a part of a base material (metal sheet);

(b) the step of forming a plated conductor circuit on the adhesive layer by an additive process;

(c) the step of connecting the plated conductor circuit to the base material by plating;

(d) the step of etching the substrate to form a lead frame provided with a die pad;

(e) the step of filling or coating an insulating material in a gap between the lead and the die pad of the lead frame or to at least one position of gaps between the leads and the surface of the lead frame.

In the production method of the semiconductor-mounting substrate according to the invention, the lead frame previously worked into leads and/or the die pad by punching, etching or the like, or the metal sheet before the working int the lead frame, or the partly worked metal sheet can be used as a starting material. However, when the metal sheet before the working into the lead frame, or the partly worked metal sheet, is used as a starting material, it is necessary that the adhesive layer be formed on the metal sheet and subsequently the plated conductor circuit is formed by the additive process, and then the sheet is worked into a lead frame of a given shape.

The die pad is a portion directly or indirectly mounting a semiconductor part thereon. It acts as a heat dissipation body when the part is directly mounted on the pad, or as a reinforcing material when the part is indirectly mounted. FIG. 14 shows an example of the lead frame used in the invention.

In the aforementioned production process of the invention, it is desirable to roughen the surface of the portion contacted with the adhesive or insulating material in the lead frame by subjecting it to an oxidation treatment, an oxidation-reduction treatment or the like. This roughening treatment is carried out for improving the bonding property between the lead and the adhesive and insulating material.

Moreover, the oxidation treatment used in the invention is a treatment wherein the surface of the lead frame is roughened by forming an oxide film having an unevenness on the surface with an oxidizing agent or the like.

The oxidation-reduction treatment is a treatment wherein the surface of the lead frame is roughened by the oxidation treatment and then the oxide film on the surface is reduced with a reducing agent.

Next, in the above production method of the invention, an insulating adhesive may be used to fill or coat the insulating material layer instead of the insulating material. In this method, the formation of the insulating material layer and the formation of the adhesive layer are simultaneously achieved, so that there is a merit to simplifying the steps.

In the production method of the invention, screen printing is desirable as a method of forming the insulating material layer or the adhesive layer between the leads or in the gap between the lead and the die pad or on the surface of the lead frame.

For example, there may be adopted a method of coating an uncured adhesive resin solution to the lead frame, a method of subjecting to screen printing, and a method of laminating an adhesive resin film at a semi-cured state, and the like.

In the production method of the invention, a plating resist may be used by printing a liquid resist and curing it through drying, and also a photo-sensitive dry film may be used by exposure and development.

BRIEF DESCRIPTION OF THE DRAWINGS

FIG. 1a–FIG. 1h are cross-sectional views showing production processes of a semiconductor-mounting substrate described in Example 1;

FIGS. 14a–14d are views showing a production process of a semiconductor-mounting substrate in Example 14;

FIG. 15 is a plan view showing an example of the lead frame used in the invention.

BEST MODE FOR CARRYING OUT THE INVENTION

EXAMPLE 1

Figure 2A:
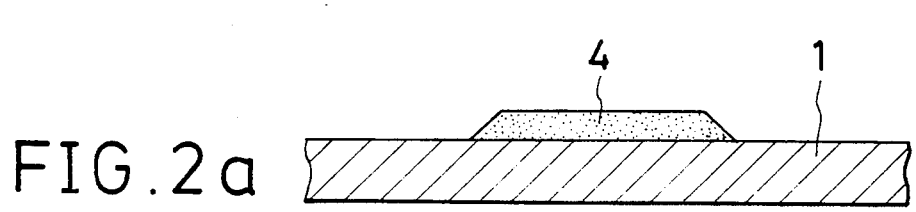
FIG. 2a–FIG. 2d are cross-sectional views showing production processes of a semiconductor-mounting substrate described in Example 2.

Production of pseudo-particles:

(1) (a) 200 g of cured epoxy resin particles (average particle size 3.9 μm) were dispersed in 5 l of acetone and stirred and mixed in a Henschel mixer to prepare a suspension.

(b) On the other hand, 300 g of cured epoxy resin powder (average particle size 0.5 μm) was dispersed in an acetone solution dissolving 30 g of epoxy resin per 1 l of acetone to prepare a suspension.

(c) Then, the latter suspension (b) was added dropwise to the former suspension (a) so that the resin particles from step (b) would adhere to the resin particles from step (a), and thereafter acetone was removed by heating the solution to 150° C. to prepare resultant pseudo-particles.

The pseudo-particles had an average particle size of 4.3 μm, about 75% by weight of which was existent within a range of ±2 μm around the average particle size.

(2) A mixture of 50 parts by weight of the pseudo-particle prepared in the above step (1), 60 parts by weight of phenol novolak type epoxy resin, 40 parts by weight of bisphenol A type epoxy resin and 4 parts by weight of imidazole hardening agent was added with butylcarbitol and prepared in a homodisper dispersing machine so as to have a viscosity of 120 cp. whereby an adhesive solution was obtained.

Forming of a lead frame:

(3) Firstly, as shown in FIG. 1a, a plating resist (etching resist) 2 was formed on a copper series metal sheet (150 μm) 1 in the usual manner.

(4) Then, the metal sheet was etched to prepare a lead frame comprised of a die pad 3b and leads 3a as shown in FIG. 1b.

(5) Next, the lead frame 3 was successively dipped in a blackening agent and a reduction treating agent having compositions as shown in Table 1, whereby the whole of the lead frame 3 was blackened and reduced to roughen it.

TABLE 1

| Blackening and reduction treatments | |
|---|---|
| Blackening agent | |
| sodium chlorite | 60 g |
| sodium hydroxide | 18 g |
| sodium phosphate | 5 g |
| sodium carbonate | 5 g |
| water | 1 l |
| Reduction treating agent | |
| aqueous solution of 30 wt % formalin | 30 ml |
| potassium hydroxide | 38 g |
| water | 1 l |

Formation of adhesive layer:

(6) Firstly, a one-side surface of the blackened and reduced lead frame 3 was laminated with a polyester film 5 coated with silicon as shown in FIG. 1c.

(7) Then, the adhesive solution prepared in the above steps (1) and (2) was coated on a given portion of the lead frame 3 (on the die pad 3a and gap between the die pad and the lead 3a) by screen printing and cured by drying at 100° C. for 1 hour and at 150° C. for 5 hours, whereby an adhesive layer 4 was formed as shown in FIG. 1d.

(8) Next, the surface of the lead frame 3 was buffed to remove an extra amount of the adhesive layer, whereby the surface was smoothed as shown in FIG. 1e.

(9) The lead frame 3 was soft-etched to remove the blackened and reduced layer.

(10) Thereafter, the lead frame was dipped in a solution of 800 g/l of chromic acid (70° C.) for 10 minutes, whereby the surface of the adhesive layer 4 was roughened to form a rough surface 4a, which was then neutralized and washed with water to form a lead frame 3f as shown in FIG. 1f.

Formation of plated conductor circuit:

(11) Firstly, a catalyst was applied to the lead frame 3f.

(12) Then, a plating resist 6 for the formation of a given conductor circuit was formed on the lead frame 3f treated by the above process, whereby a lead frame 3g was obtained as shown in FIG. 1g.

(13) The lead frame 3g treated at the above step (12) was flash-plated by using an electroless copper plating solution of a composition shown in Table 2, and thereafter subjected to an electro-plating with an electrolytic copper plating solution of a composition shown in Table 3 at a current density of 2 $A/cm^2$, and then the above plating resist was removed to produce a semiconductor-mounting substrate having plated conductor circuits 7 according to the invention as shown in FIG. 1h.

TABLE 2

| Composition of electroless copper plating solution (50°) | |
|---|---|
| NaOH | 4 g/l |
| EDTA | 0.12 mol/l |
| Formalin | 5% |
| Copper sulfate | 4.0 g/l |
| Additive | little |

TABLE 3

| Composition of electrolytic copper plating solution (30°) | |
|---|---|
| Sulfuric acid | 180 g/l |
| Copper sulfate | 80 g/l |
| NaCl | 50 mg/l |
| Additive | 20 mg/l |

EXAMPLE 2

(1) An adhesive solution was prepared in the same manner as in Example 1. That is, butylcarbitol was added to a mixture of 60 parts by weight of phenol novolak type epoxy resin, 40 parts by weight of bisphenol A type epoxy resin, 4 parts by weight of imidazole hardening agent, coarse particles for the formation of anchor, 10 parts by weight of epoxy resin particle (average particle size 3.9 μm) as a fine powder and 25 parts by weight of epoxy resin (average particle size 0.5 μm) to prepare the adhesive solution.

(2) After a roughening, resist was formed on a copper metal sheet (150 μm) with a dry film, a necessary portion was subjected to a blackening treatment and then the dry film was removed.

(3) Then, an adhesive for electroless plating was applied to the blackened metal sheet 1 by screen printing and cured by drying at 100° C. for 1 hour and at 150° C. for 5 hours to obtain a metal sheet 1 as shown in FIG. 2a.

(4) Next, the metal sheet 1 was dipped in a solution of 800 g/l of chromic acid (70° C.) for 10 minutes to roughen the surface of an adhesive layer 4, which was neutralized and then washed with water.

(5) A catalyst was applied on the adhesive layer 4 treated at the step (4) in the usual manner.

Figure 2B:
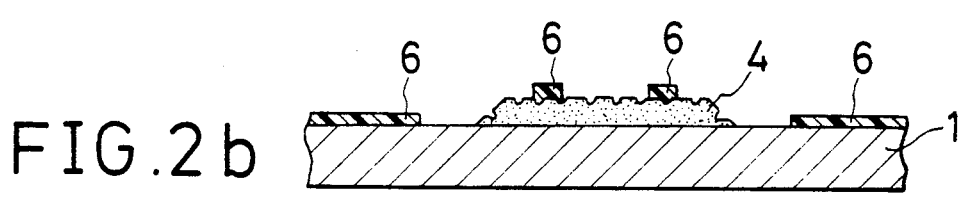

(6) Then, a photo-sensitive liquid resist was coated on a full surface of the metal sheet 1 obtained at the step (5), which was exposed to parallel light and developed to form a plating resist 6 as shown in FIG. 2b.

(7) Next, the metal sheet 1 treated at the step (6) was flask-plated with a chemical copper, pattern-plated with an electrolytic copper, and then the plating resist was removed to obtain the metal sheet 1 provided with a conductor circuit 7.

Figure 2C:
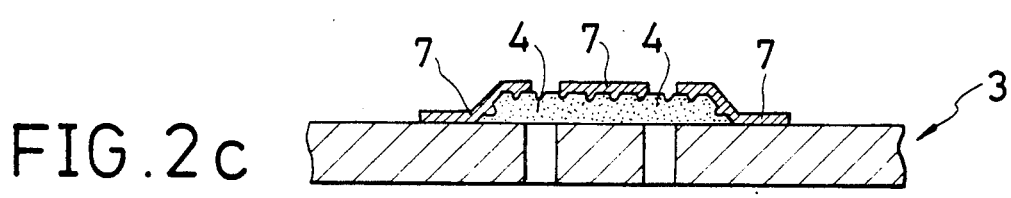

(8) Thereafter, a liquid resist was coated on the metal sheet 1 treated at the step (7) to form an etching resist, which was etched to form a lead frame 3 as shown in FIG. 2c.

Figure 2D:
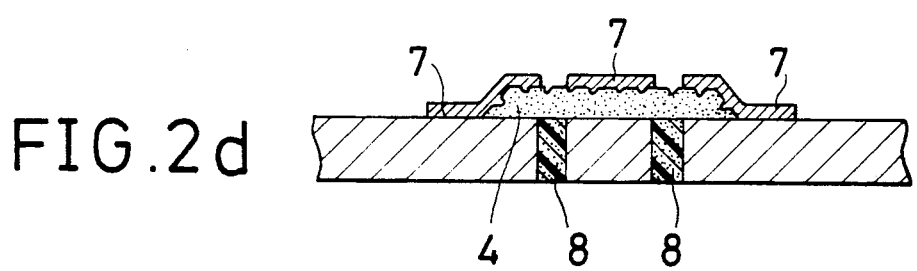

(9) An insulating adhesive (epoxy resin containing an inorganic filler) 8 other than the above adhesive layer 4 was filled in the gap portions of the lead frame 3 formed by etching treatment at the step (8) to produce a semiconductor-mounting substrate according to the invention as shown in FIG. 2d.

EXAMPLE 3

This example fundamentally shows the production of a semiconductor-mounting substrate in the same manner as in Example 1.

(1) (a) 200 g of cured epoxy resin particles (average particle size 3.9 μm) was dispersed into acetone of 5 l and stirred and mixed in a Henschel mixer to prepare a suspension.

(b) On the other hand, 300 g of cured epoxy resin powder (average particle size 0.5 μm) was dispersed into an acetone solution dissolving 30 g of epoxy resin per 1 l of acetone to prepare a suspension.

(c) Then, the latter suspension (b) was added dropwise to the former suspension (a), and thereafter acetone was removed by heating the solution to 150° C. to prepare pseudo-particles.

The pseudo-particles had an average particle size of 4.3 μm, about 75% by weight of which was existent within a range of ±2 μm around the average particle size.

(2) Then, 60 parts by weight of 50% acrylated cresol novolak type resin was mixed with 60 parts by weight of 50% acrylated bisphenol A type epoxy resin, 40 parts by weight of bisphenol A type epoxy resin, 15 parts by weight of diallylterephthalate, 4 parts by weight of 2-methyl-1-[4-methylthio)-phenyl]-2-morpholinopropanone-1, 4 parts by weight of imidazole hardening agent and 50 parts by weight of pseudo-particles formed at the above step (1), and then the viscosity was adjusted to 250 cp in a homodisper dispersing machine while adding butylcellosolve and kneaded through three rollers to form an adhesive solution of photo-sensitive resin composition.

(3) Next, the solution of the above step (2) was coated on a lead frame 3 to form an adhesive layer 4.

(4) Thereafter, the lead frame 3 was dried and subjected to an exposure treatment to form holes in the above adhesive layer 4.

Figure 3:
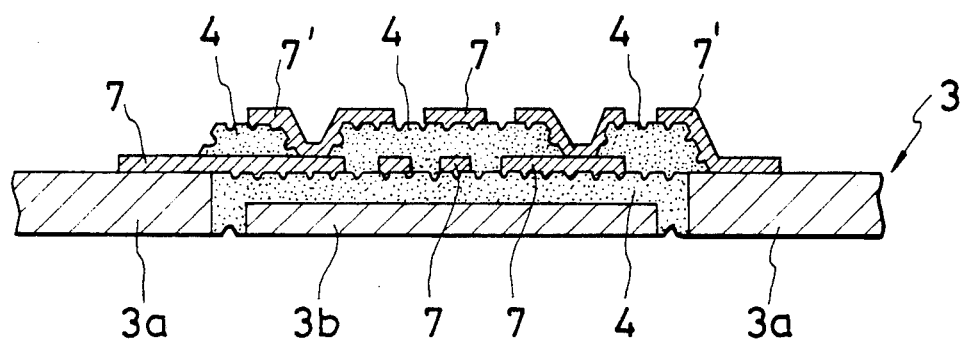
FIG. 3 is a cross-sectional view of a semiconductor-mounting substrate produced in Example 3.

(5) After the surface of the adhesive layer 4 was roughened in the same manner as in (10) of Example 1 and a plating resist was formed, plural layers of conductor circuit 7 were formed by subjection to an electroless plating, whereby a semiconductor-mounting substrate provided with a multilayer conductor circuit on the lead frame 3 having a die pad 3b and leads 3a was produced as shown in FIG. 3.

EXAMPLE 4

Figure 4:
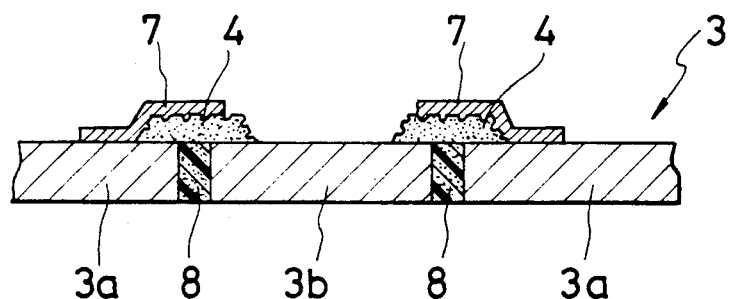
FIG. 4 is a cross-sectional view of a semiconductor-mounting substrate produced in Example 4.

This example fundamentally shows the same production as in Example 2. This is an example of a semiconductor-mounting substrate as shown in FIG. 4, wherein a plated conductor circuit 7 is formed through an adhesive layer 4 arranged just above the gap portion between a die pad 3b and a lead 3a by an additive process without coating the adhesive solution on the die pad portion 3b. Further, an adhesive (epoxy resin containing inorganic filler) 8, other than the adhesive layer 4, is filled into a gap portion removed by the etching treatment.

EXAMPLE 5

Figure 5A:
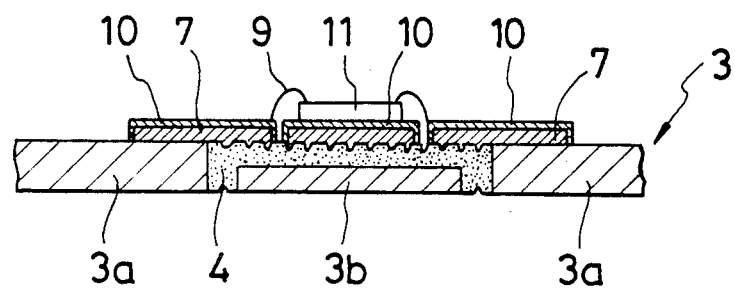
FIG. 5a and FIG. 5b are a cross-sectional view and a plan view of a semiconductor-mounting substrate produced by the method of the invention.
Figure 5B:
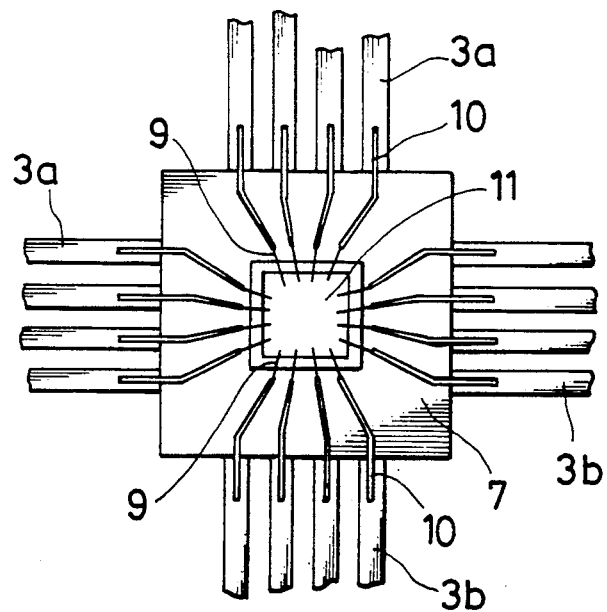

In FIGS. 5a and 5b, there is shown an embodiment of a semiconductor-mounting substrate, in which nickel plating is further carried out on the surface of the conductor circuit 7 to the lead frame 3 comprised of leads 3a and the die pad 3b described in Example 1, and thereafter gold plating is carried out to form a gold-nickel plated layer 10 and an IC chip 11 is mounted thereon, and the IC chip 11 and the gold-nickel plated conductor circuit 10 are connected to each other with gold wire 9 by wire bonding.

EXAMPLE 6

Figure 6A:
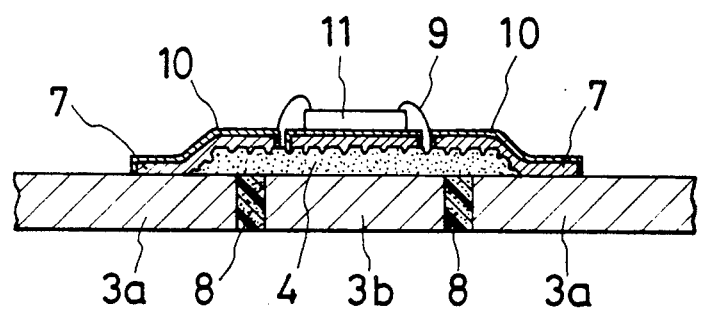
FIG. 6a and FIG. 6b are a cross-sectional view and a plan view of a semiconductor-mounting substrate produced by the method of the invention.
Figure 6B:
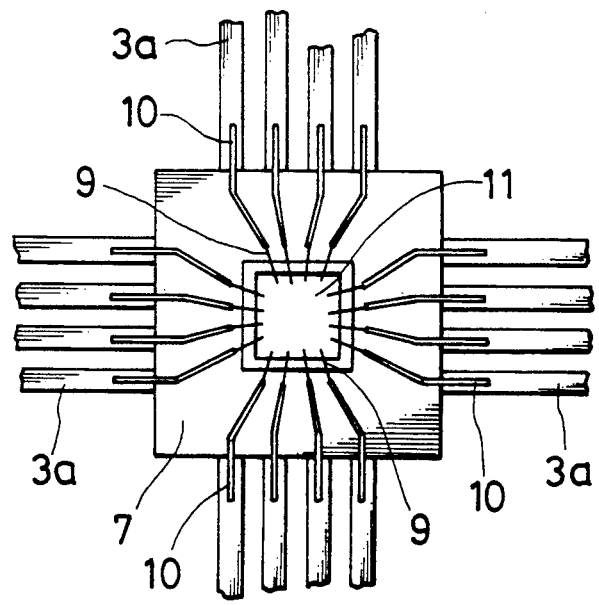

FIGS. 6a and 6b show an embodiment of a semiconductor-mounting substrate, in which a gold-nickel plated layer 10 is formed on the surface of the conductor circuit 7 by nickel plating and subsequently by gold plating on the semiconductor-mounting substrate obtained in Examine 2. An IC chip 11 and the gold-nickel plated conductor circuit 10 are connected to each other with gold wire 9 by wire bonding.

EXAMPLE 7

Figure 7:
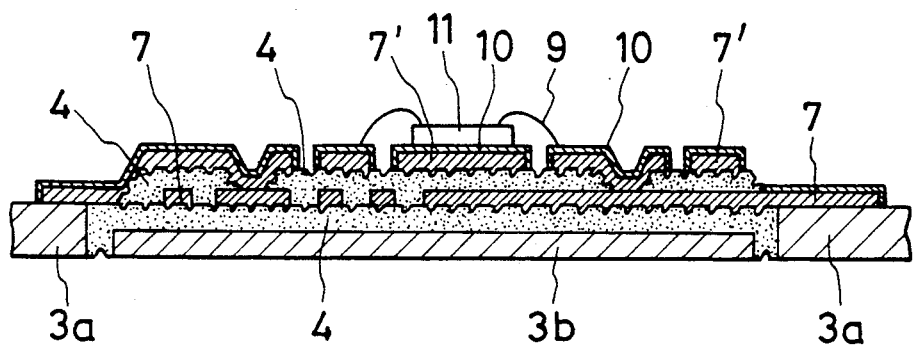
FIG. 7, FIG. 8 and FIG. 9 are cross-sectional views of other embodiments of a semiconductor-mounting substrate according to the invention.

FIG. 7 shows an embodiment in which a gold-nickel plated layer 10 is formed on upper conductor circuit 7' of the multilayered semiconductor-mounting substrate obtained in Example 3 and an IC chip 11 is mounted thereon.

EXAMPLE 8

Figure 8:
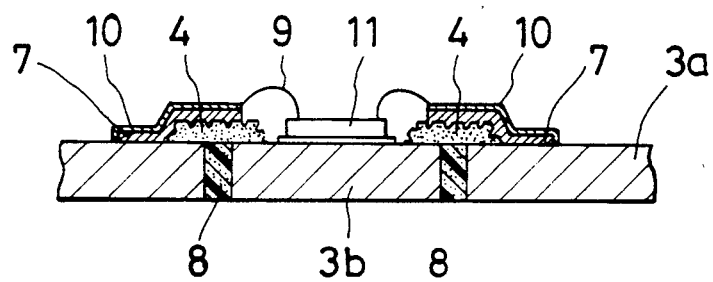

FIG. 8 shows an embodiment in which a gold-nickel plated layer 10 is formed on the semiconductor-mounting substrate obtained in Example 4 and an IC chip 11 is mounted thereon.

EXAMPLE 9

Figure 9:
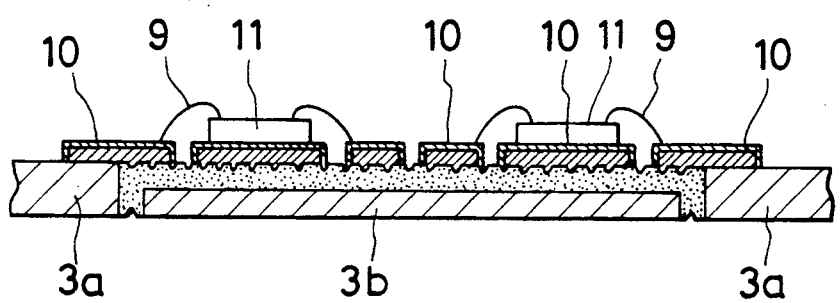

FIG. 9 shows an embodiment of a multi-chip type in which two IC chips 11 are mounted on the semiconductor-mounting substrate obtained in Example 1.

EXAMPLE 10

Figure 10A:
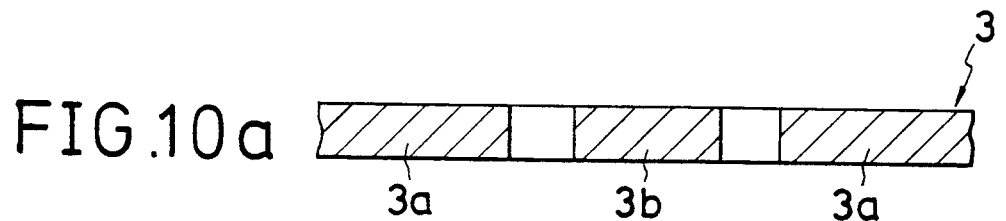
FIGS. 10a–10g are views showing a production process of a semiconductor-mounting substrate described in Example 10.
Figure 10B:
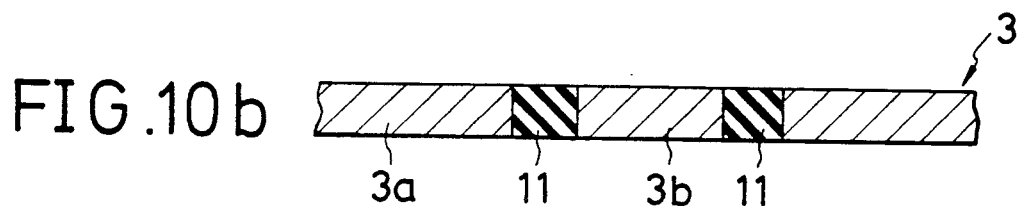

(1) A metal sheet was punched out to form a lead frame 3 as shown in FIG. 10a, and a sealing resin, that is, an insulating material 11, was embedded and cured in gaps between leads 3a and a die pad 3b of the lead frame 3 as shown in FIG. 10b.

(2) Then, butylcarbitol was added to a mixture of 60 parts by weight of phenol novolak type epoxy resin, 40 parts by weight of bisphenol A-type epoxy resin, 4 parts by weight of imidazole hardening agent, 10 parts by weight of epoxy resin particles having a large particle size (particle size 3.9 μm) and 25 parts by weight of epoxy resin powder having a small particle size (particle size 0.5 μm), a viscosity of which was adjusted to 250 cps in a homodisper dispersing machine, and then formed by three rollers to prepare an adhesive solution.

Figure 10C:
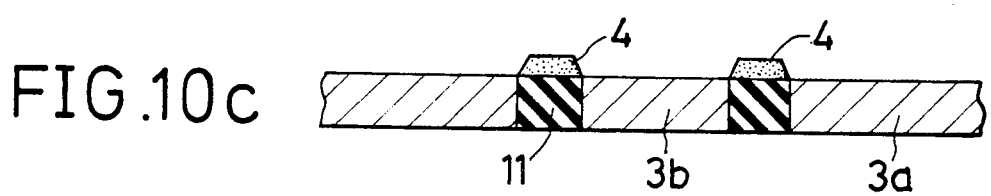

The adhesive solution was coated on only the portions filled with the above sealing resin or insulating material 11 and cured by drying at 100° C. for 1 hour and at 150° C. for 5 hours to form an layer 4 as shown in FIG. 10c.

Figure 10D:
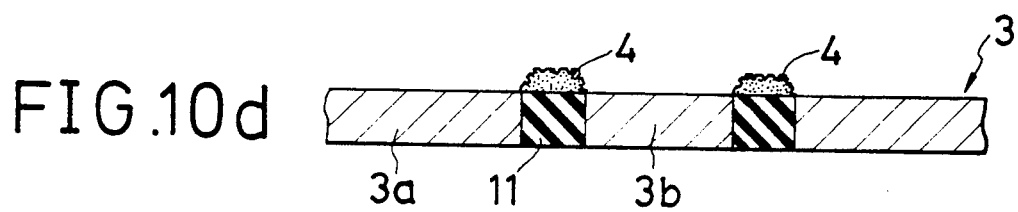

(3) Then, the lead frame, after the treatment of the above step, was dipped in a solution of 800 g/l chromic acid (70° C.) for 10 minutes to roughen the surface of the adhesive layer 4, as shown in FIG. 10d, and then was neutralized and washed with water.

(4) Next, a catalyst was applied on the adhesive layer 4 having the roughened surface of the lead frame 3.

Figure 10E:
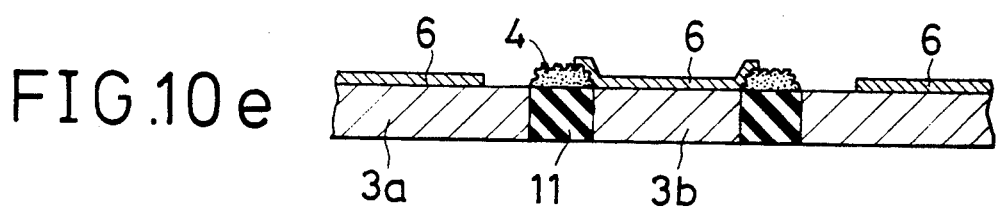

(5) Thereafter, as shown in FIG. 10e, a photo-sensitive liquid resin was coated on the lead frame 3 to form a plating resist 6 for the formation of a given conductor circuit.

Figure 10F:
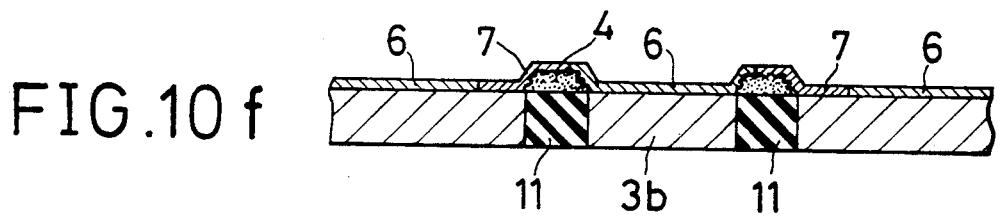
Figure 10G:
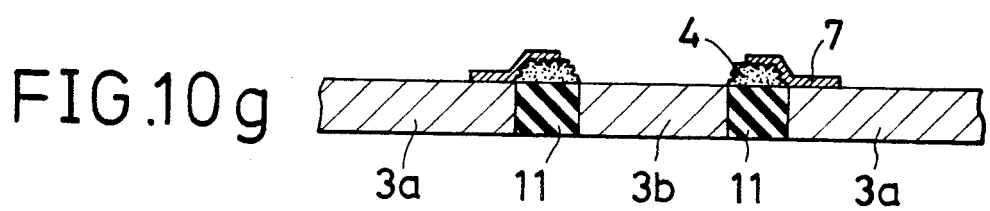
Figure 11A:
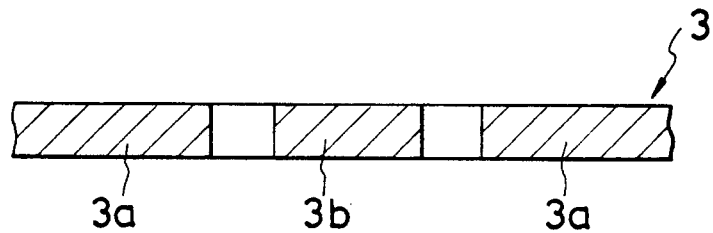
FIGS. 11a–11f are views showing a production process of a semiconductor-mounting substrate in Example 11.
Figure 11B:
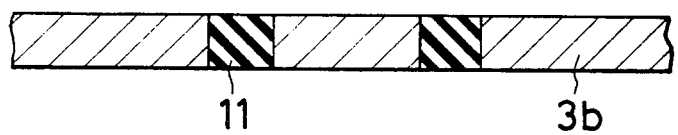
Figure 11C:
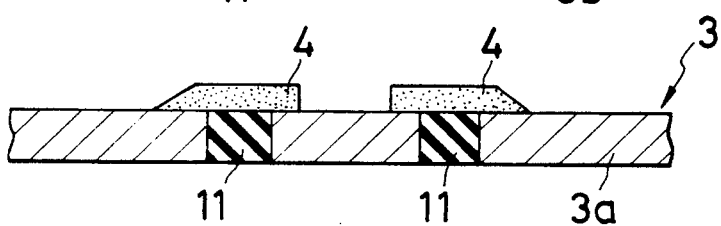
Figure 11D:
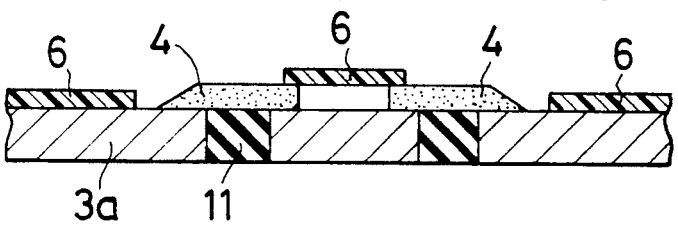
Figure 11E:
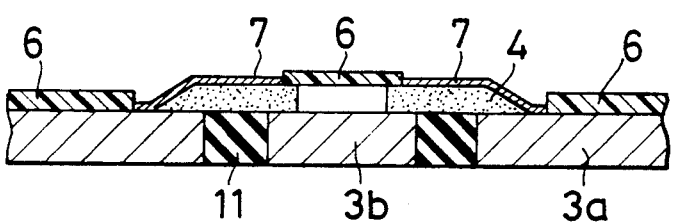
Figure 11F:
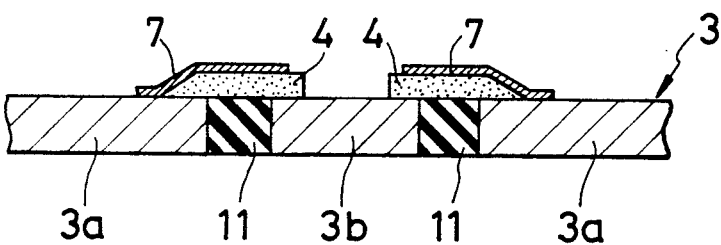

(6) Then, the surface of the lead frame 3, after the treatment of the above step (5), was subjected to an electroless copper plating to form a plated conductor circuit 7 as shown in FIG. 10f. Thereafter, the plating resist 6 was removed to produce a semiconductor-mounting substrate as shown in FIG. 10g.

EXAMPLE 11

This example, as shown in FIG. 11, is fundamentally the same as described in Example 10. At first, a metal sheet was punched out to form a lead frame 3 (FIG. 11a), and an insulating material 11 was filled in gaps between die pad 3b and leads 3a of the thus obtained lead frame 3 (FIG. 11b). Then, the adhesive solution was coated on not only the insulating material 11 but also a part of the lead frame to form an adhesive layer 4 (FIG. 11c). A plating resist 6 was formed (FIG. 11d). Then, a conductor circuit 7 was formed (FIG. 11e). The plating resist 6 was removed to produce a semiconductor-mounting substrate as shown in FIG. 11f.

EXAMPLE 12

(1) An adhesive solution was prepared in the same manner as in the step (2) of Example 10.

Figure 12A:
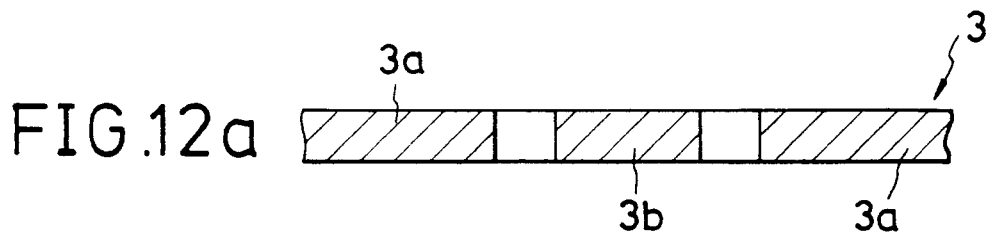
FIGS. 12a–12g are views showing a production process of a semiconductor-mounting substrate in Example 12.
Figure 12B:
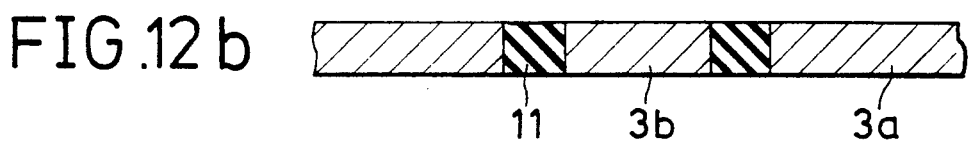

(2) An insulating material 11 was filled in gaps between leads 3a and a die pad 3b of the lead frame 3 prepared by a punching process as shown in FIG. 12a and cured into a lead frame 3 as shown in FIG. 12b.

(3) The adhesive solution of the above step (1) was coated on the lead frame 3 filled with the insulating material 11 treated at the step (2) and cured by drying at 100° C. for 1 hour and at 150° C. for 5 hours to form an adhesive layer 4.

Figure 12C:
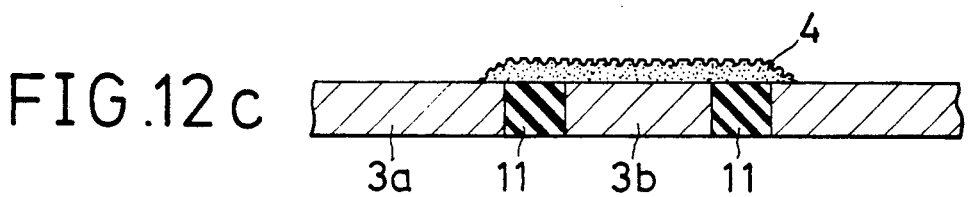

(4) Then, the lead frame 3, treated at the above step (3), was dipped in a solution of 800 g/l chromic acid (70° C.) for 10 minutes to roughen the surface of the adhesive layer 4, which lead frame was neutralized and washed with water to obtain a lead frame as shown in FIG. 12c.

(5) Next, a catalyst was applied on the adhesive layer 4 on the lead frame 3 according to the usual manner.

Figure 12D:
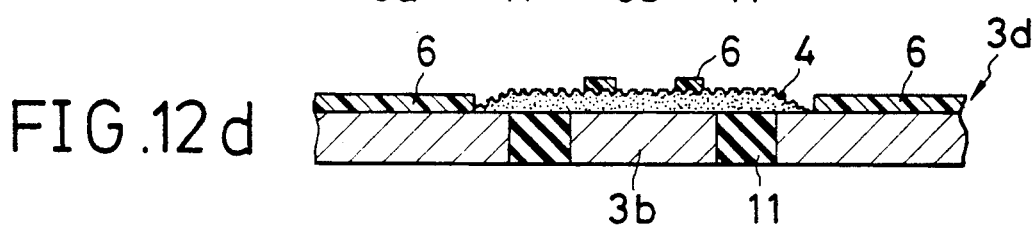

(6) Thereafter, in order to form a given conductor circuit, a photo-sensitive resin was coated on the surface of the lead frame 3 and portions of the adhesive layer 4 not forming a pattern (conductor circuit). Then, the resin was exposed to light and developed to form a plating resist 6 as shown in FIG. 12d.

Figure 12E:
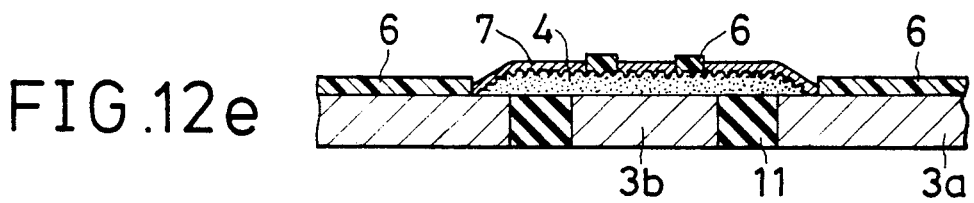
Figure 12F:
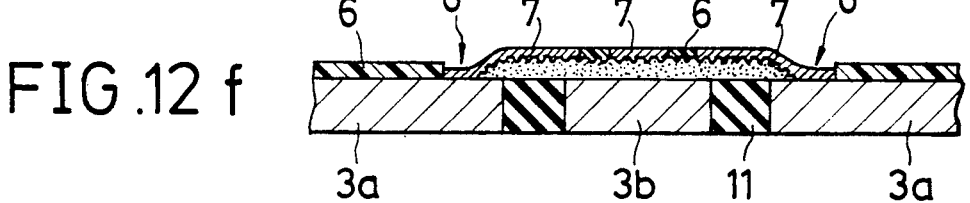

(7) The lead frame 3 treated in the above step (6) was subjected to an electroless copper plating to form a conductor circuit 7 on only the adhesive layer 4 as shown in FIG. 12e.

Figure 12G:
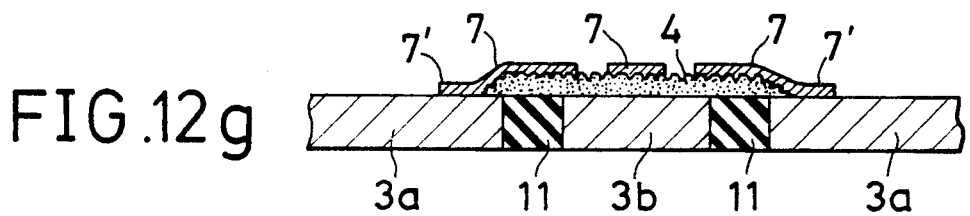

(8) Then, a part of the plating resist 6 on the lead frame 3 was removed and seeding was applied to only the peeled portion 6'. The lead frame 3 was subjected to an electroless copper plating and further to pattern electro-plating (connection circuit) 7' to electrically connect the leads 3a and the conductor circuit 7 to the connection circuit 7'. As a result, there was produced a semiconductor-mounting substrate as shown in FIG. 12g.

EXAMPLE 13

Figure 13A:
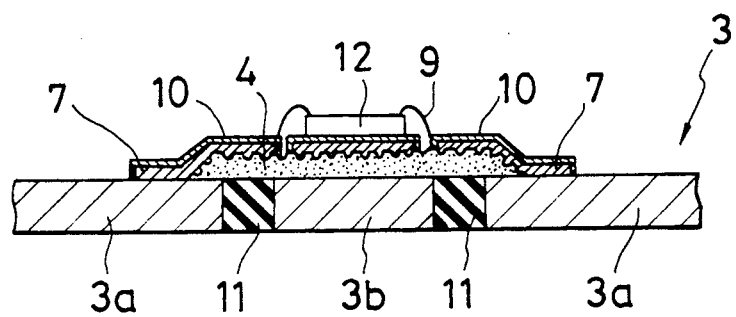
FIG. 13a–FIG. 13b are a cross-sectional view and a plan view of a semiconductor-mounting substrate described in Example 13.
Figure 13B:
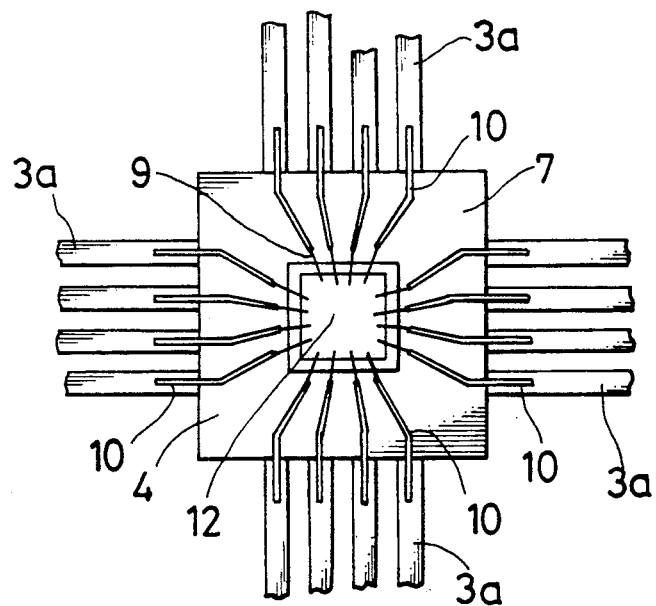

In FIGS. 13a and 13b, there is shown an embodiment in which the semiconductor-mounting substrate consists of leads 3a and a die pad 3b obtained by the method of Example 12. The substrate then is subjected to nickel plating and further to gold plating to form a gold-nickel plated layer 10 and an IC chip 12 is mounted thereto. The IC chip 12 and the alloy-plated conductor circuit 10 are connected with gold wire 9 by wire bonding.

EXAMPLE 14

In an example shown in FIG. 14, the same procedure as in the step (1) to the step (8) of Example 2 was repeated to prepare a substrate 1 as shown in FIG. 14b. Then, the substrate 1 was etched to form a lead frame 3 as shown in FIG. 14c, and thereafter an adhesive 4 was filled in gaps of the lead frame 3 to produce a semiconductor-mounting substrate as shown in FIG. 14d.

FIG. 15 is a plan view of the lead frame, in which 3a is a lead and 3b is a die pad.

According to the invention, the above semiconductor-mounting substrate is subjected to a resin sealing in a transfer mold by using epoxy resin.

We claim:

1. A semiconductor-mounting substrate comprising a lead frame, an adhesive layer formed on a part of the lead frame, an electrical circuit formed through the adhesive layer by an additive process, and a plated conductor circuit for connecting the said electrical circuit to leads of said lead frame, wherein said adhesive layer is a heat-resistant fine powder being soluble in an oxidizing agent or an acid into a heat-resistant resin being hardly soluble in the oxidizing agent or acid and at least a conductor circuit forming surface thereof is formed as a rough surface by a roughening treatment with said oxidizing agent or acid.

2. The semiconductor-mounting substrate according to claim 1, wherein said rough surface of said adhesive layer is formed by dispersing at least one heat-resistant particle soluble in an oxidizing agent which is selected from the group consisting of (1) a mixture of heat-resistant resin particles having an average particle size of 2–10 μm and fine powder of heat-resistant resin having an average particle size of not more than 2 μm; (2) pseudo-particles obtained by adhering fine powder of heat-resistant resin having an average particle size of not more than 2 μm to a surface of heat-resistant resin particles having an average particle size of 2 to not more than 10 μm and (3) the pseudo-particles having an average particle size of 2-10 μm obtained by combining said fine powder of heat-resistant resin having an average particle size of not more than 2 μm with said heat-resistant resin hardly soluble in said oxidizing agent or acid.

3. A semiconductor-mounting substrate comprising a lead frame, an insulating material arranged in at least one position among a gap between a lead of the lead frame and a die pad, or a gap between the leads and a surface of the lead frame, an adhesive layer formed on at least a part of the lead frame, an electrical circuit formed through the adhesive layer by an additive process, and a plated conductor for connecting the said electrical circuit to said leads of the lead frame, wherein said adhesive layer is a heat-resistant fine powder being soluble in an oxidizing agent or an acid into a heat-resistant resin being hardly soluble in the oxidizing agent or acid and at least a conductor circuit forming surface thereof is formed as a rough surface by a roughening treatment with said oxidizing agent or acid.

4. The semiconductor-mounting substrate according to claim 3, wherein said rough surface of said adhesive layer is formed by dispersing at least one heat-resistant particle soluble in an oxidizing agent or acid which is selected from the group consisting of (1) a mixture of heat-resistant resin particles having an average particle size of 2-10 μm and fine powder of heat-resistant resin having an average particle size of not more than 2 μm; (2) pseudo-particles obtained by adhering fine powder of heat-resistant resin having an average particle size of not more than 2 μm to a surface of heat-resistant resin particles having an average particle size of 2 to not more than 10 μm and (3) said pseudo-particles having an average particle size of 2-10 μm obtained by combining said fine powder of heat-resistant resin having an average particle size of not more than 2 μm with said heat-resistant resin hardly soluble in said oxidizing agent or acid.

5. A method of producing a semiconductor-mounting substrate formed by arranging an electrical circuit on a lead frame through an insulating layer, characterized in that said semiconductor-mounting substrate is produced through each of the following steps (a), (b), (c) and (d):
   (a) a step of shaping a base material into a lead frame;
   (b) a step of forming an adhesive layer on at least a part of the lead frame;
   (c) a step of forming a conductor circuit on the adhesive layer by an additive process;
   (d) a step of connecting the conductor circuit to leads of the lead frame through a conductor circuit for connection obtained by plating,
   said adhesive layer is a heat-resistant fine powder being soluble in an oxidizing agent or an acid into a heat-resistant resin being hardly soluble in the oxidizing agent or acid and at least a conductor circuit forming surface thereof is formed as a rough surface by a roughening treatment with said oxidizing agent or acid.

6. The method according to claim 5, wherein said rough surface of said adhesive layer is formed by dispersing at least one heat-resistant particle soluble in an oxidizing agent or acid which is selected from the group consisting of (1) a mixture of heat-resistant resin particles having an average particle size of 2-10 μm and fine powder of heat-resistant resin having an average particle size of not more than 2 μm; (2) pseudo-particles obtained by adhering fine powder of heat-resistant resin having an average particle size of not more than 2 μm to a surface of heat-resistant resin particles having an average particle size of 2 to not more than 10 μm and (3) said pseudo-particles having an average particle size of 2-10 μm obtained by combining said fine powder of heat-resistant resin having an average particle size of not more than 2 μm with said heat-resistant resin hardly soluble in said oxidizing agent or acid.

7. A method of producing a semiconductor mounting substrate formed by arranging an electrical circuit on a lead frame through an insulating layer, characterized in that said semiconductor-mounting substrate is produced through each of the following steps (a), (b), (c), (d) and (e):
   (a) a step of shaping a base material into a lead frame;
   (b) a step of filling or coating an insulating material in a gap between a lead and a die pad of the lead frame, or a gap between the leads and a surface of the lead frame;
   (c) a step of forming an adhesive layer on at least a portion of said lead frame by filling or coating the insulating material;
   (d) a step of forming a plated conductor circuit on said adhesive layer by an additive process;
   (e) a step of connecting the said plated conductor circuit to said leads of said lead frame by plating,
   said adhesive layer is a heat-resistant fine powder being soluble in an oxidizing agent or an acid into a heat-resistant resin being hardly soluble in the oxidizing agent or acid and at least a conductor circuit forming surface thereof is formed as a rough surface by a roughening treatment with said oxidizing agent or acid.

8. The method according to claim 7, wherein said rough surface of said adhesive layer is formed by dispersing at least one heat-resistant particle soluble in an oxidizing agent or acid which is selected from the group consisting of (1) a mixture of heat-resistant resin particles having an average particle size of 2-10 μm and fine powder of heat-resistant resin having an average particle size of not more than 2 μm; (2) pseudo-particles obtained by adhering fine powder of heat-resistant resin having an average particle size of not more than 2 μm to a surface of heat-resistant resin particles having an average particle size of 2 to not more than 10 μm and (3) said pseudo-particles having an average particle size of 2-10 μm obtained by combining said fine powder of heat-resistant resin having an average particle size of not more than 2 μm with said heat-resistant resin hardly soluble in said oxidizing agent or acid.

9. A method of producing a semiconductor-mounting substrate formed by arranging an electrical circuit on a lead frame through an insulating layer, characterized in that said semiconductor-mounting substrate is produced through each of the following steps (a), (b), (c) and (d):
   (a) a step of forming an adhesive layer on at least a part of a base material;
   (b) a step of forming a plated conductor circuit on said adhesive layer by an additive process;
   (c) a step of connecting said plated conductor circuit to a part of the base material by plating;
   (d) a step of subjecting the substrate to an etching to form a lead frame,
   said adhesive layer is a heat-resistant fine powder being soluble in an oxidizing agent or an acid into a heat-resistant resin being hardly soluble in the oxidizing agent or acid and at least a conductor circuit forming surface thereof is formed as a rough surface by a roughening treatment with said oxidizing agent or acid.

10. The method according to claim 9, wherein said rough surface of said adhesive layer is formed by dispersing at least one heat-resistant particle soluble in an oxidizing agent or acid which is selected from the group consisting of (1) a mixture of heat-resistant resin particles having an average particle size of 2-10 μm and fine powder of heat-resistant resin having an average particle size of not more than 2 μm; (2) pseudo-particles obtained by adhering fine powder of heat-resistant resin having an average particle size of not more than 2 μm to a surface of heat-resistant resin particles having an average particle size of 2 to not more than 10 μm and (3) said pseudo-particles having an average particle size of 2-10 μm obtained by combining said fine powder of heat-resistant resin having an average particle size of not more than 2 μm with said heat-resistant resin hardly soluble in said oxidizing agent or acid.

11. A method of producing a semiconductor-mounting substrate formed by arranging an electrical circuit on a lead frame through an insulating layer, characterized in that said semiconductor-mounting substrate is produced through each of the following steps (a), (b), (c), (d) and (e):
 (a) a step of forming an adhesive layer on at least a part of a base material;
 (b) a step of forming a plated conductor circuit on said adhesive layer by an additive process;
 (c) a step of connecting said plated conductor circuit to a part of said base material by plating;
 (d) a step of subjecting the base material to an etching to form a lead frame;
 (e) a step of filling or coating an insulating material in at least one gap between a lead of said lead frame and a die pad, or a gap between the leads and a surface of the lead frame,
 said adhesive layer is a heat-resistant fine powder being soluble in an oxidizing agent or an acid into a heat-resistant resin being hardly soluble in the oxidizing agent or acid and at least a conductor circuit forming surface thereof is formed as a rough surface by a roughening treatment with said oxidizing agent or acid.

12. The method according to claim 11, wherein said rough surface of said adhesive layer is formed by dispersing at least one heat-resistant particle soluble in an oxidizing agent or acid which is selected from the group consisting of (1) a mixture of heat-resistant resin particles having an average particle size of 2-10 μm and fine powder of heat-resistant resin having an average particle size of not more than 2 μm; (2) pseudo-particles obtained by adhering fine powder of heat-resistant resin having an average particle size of not more than 2 μm to a surface of heat-resistant resin particles having an average particle size of 2 to not more than 10 μm and (3) said pseudo-particles having an average particle size of 2-10 μm obtained by combining said fine powder of heat-resistant resin having an average particle size of not more than 2 μm with said heat-resistant resin hardly soluble in said oxidizing agent or acid.

* * * * *